United States Patent
Seo et al.

(10) Patent No.: US 10,033,016 B2
(45) Date of Patent: Jul. 24, 2018

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Nobuharu Ohsawa, Kanagawa (JP); Toshiki Sasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 3 days.

(21) Appl. No.: 15/227,618

(22) Filed: Aug. 3, 2016

(65) Prior Publication Data

US 2017/0033321 A1 Feb. 2, 2017

Related U.S. Application Data

(63) Continuation of application No. 14/639,394, filed on Mar. 5, 2015, now Pat. No. 9,412,793.

(30) Foreign Application Priority Data

Mar. 7, 2014 (JP) ................................. 2014-044963
Mar. 7, 2014 (JP) ................................. 2014-045021

(51) Int. Cl.
*H01L 29/20* (2006.01)
*H01L 51/52* (2006.01)
(Continued)

(52) U.S. Cl.
CPC ........ *H01L 51/5281* (2013.01); *H01L 27/322* (2013.01); *H01L 27/3213* (2013.01);
(Continued)

(58) Field of Classification Search
None
See application file for complete search history.

(56) References Cited

U.S. PATENT DOCUMENTS

2007/0035243 A1 2/2007 Lee
2009/0091238 A1 4/2009 Cok et al.
(Continued)

FOREIGN PATENT DOCUMENTS

CN 101983397 A 3/2011
JP 2007-053090 A 3/2007
(Continued)

OTHER PUBLICATIONS

International Search Report re Application No. PCT/IB2015/051342, dated Jun. 16, 2015.
(Continued)

*Primary Examiner* — Hung Vu
(74) *Attorney, Agent, or Firm* — Husch Blackwell LLP

(57) ABSTRACT

Provided is a light-emitting device which can emit monochromatic light with high purity due to a microcavity effect and which can emit white light in the case of a combination of monochromatic light. Provided is a high-definition light-emitting device. Provided is a light-emitting device with low power consumption. In a light-emitting device with a white-color filter top emission structure, one pixel is formed of four sub-pixels of RBGY, an EL layer includes a first light-emitting substance which emits blue light and a second light-emitting substance which emits light corresponding to a complementary color of blue, and a semi-transmissive and semi-reflective electrode (an upper electrode) is formed so as to cover an edge portion of the EL layer.

14 Claims, 7 Drawing Sheets

(51) Int. Cl.
*H01L 27/32* (2006.01)
*H01L 51/00* (2006.01)
*H01L 51/50* (2006.01)

(52) U.S. Cl.
CPC ...... *H01L 51/0097* (2013.01); *H01L 51/5215* (2013.01); *H01L 51/5218* (2013.01); *H01L 51/5221* (2013.01); *H01L 51/5234* (2013.01); *H01L 51/5265* (2013.01); *H01L 27/3244* (2013.01); *H01L 51/5044* (2013.01); *H01L 51/5231* (2013.01); *H01L 2251/5338* (2013.01)

(56) References Cited

U.S. PATENT DOCUMENTS

| | | | |
|---|---|---|---|
| 2010/0230688 A1* | 9/2010 | Mitsuya | H01L 51/5036 257/89 |
| 2010/0231484 A1 | 9/2010 | Cok et al. | |
| 2011/0109611 A1 | 5/2011 | Nakamura | |
| 2011/0156996 A1 | 6/2011 | Izumi | |
| 2012/0169683 A1* | 7/2012 | Hong | H01L 27/3211 345/206 |
| 2012/0206675 A1 | 8/2012 | Seo et al. | |
| 2013/0264549 A1 | 10/2013 | Yamazaki et al. | |
| 2013/0265320 A1 | 10/2013 | Yamazaki et al. | |
| 2014/0117339 A1 | 5/2014 | Seo | |
| 2014/0134771 A1 | 5/2014 | Noda et al. | |
| 2014/0225102 A1 | 8/2014 | Ikeda et al. | |
| 2014/0284575 A1 | 9/2014 | Sugisawa et al. | |
| 2014/0284576 A1 | 9/2014 | Sugisawa et al. | |
| 2015/0263076 A1 | 9/2015 | Seo et al. | |

FOREIGN PATENT DOCUMENTS

| | | |
|---|---|---|
| JP | 2010-140742 A | 6/2010 |
| JP | 2010-147179 A | 7/2010 |
| JP | 2010-541180 | 12/2010 |
| JP | 2011-141412 A | 7/2011 |
| JP | 2012-182127 A | 9/2012 |
| JP | 2012-226360 A | 11/2012 |
| JP | 2012-252822 A | 12/2012 |
| KR | 2010-0134652 A | 12/2010 |
| KR | 2012-0092507 A | 8/2012 |
| TW | 201003591 | 1/2010 |
| TW | 201320429 | 5/2013 |
| WO | WO 2009/122998 A1 | 10/2009 |
| WO | WO 2013/047457 A1 | 4/2013 |

OTHER PUBLICATIONS

Written Opinion re Application No. PCT/IB2015/051342, dated Jun. 16, 2015.

* cited by examiner

FIG. 4D1   FIG. 4D2

LIGHT-EMITTING ELEMENT, LIGHT-EMITTING DEVICE, ELECTRONIC DEVICE, AND LIGHTING DEVICE

This application is a continuation of copending U.S. application Ser. No. 14/639,394, filed on Mar. 5, 2015 which is incorporated herein by reference.

TECHNICAL FIELD

One embodiment of the present invention relates to a light-emitting element in which an organic compound capable of providing light emission by application of an electric field is provided between a pair of electrodes, and also relates to a light-emitting device, an electronic device, and a lighting device including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

As next generation lighting devices or display devices, display devices using light-emitting elements (organic EL elements) in which organic compounds are used as light-emitting substances have been developed, announced, and partially commercialized because of their potential for thinness, lightness, high speed response to input signals, low power consumption, and the like.

In an organic EL element, voltage application between electrodes between which a light-emitting layer is provided causes recombination of electrons and holes injected from the electrodes, which brings a light-emitting substance that is an organic compound into an excited state, and the return from the excited state to the ground state is accompanied by light emission. Since the spectrum of light emitted from a light-emitting substance is peculiar to the light-emitting substance, use of different types of organic compounds for light-emitting substances makes it possible to provide light-emitting elements which exhibit various colors.

In the case of light-emitting devices which are expected to display images, such as displays, at least three-color light, i.e., red light, green light, and blue light, is necessary for reproduction of full-color images. Further, to enhance image quality with favorable color reproducibility, various efforts such as use of a microcavity structure and a color filter have been made to improve color purity.

A light-emitting device with lower power consumption due to addition of white light to three-color light (red light, green light, and blue light) has been proposed and commercialized.

There are mainly three methods to realize full-color display using the light-emitting elements described above: so-called side-by-side patterning in which light-emitting elements which emit light of different colors are separately formed; a white-color filter method (white-CF method) in which white color light-emitting element is combined with a color filter; and a color conversion method in which a light-emitting element which emits monochromatic light such as a blue light-emitting element is combined with a color conversion filter. Each of the methods has advantages and disadvantages.

PATENT DOCUMENT

[Patent Document 1] Japanese Published Patent Application No. 2007-53090

DISCLOSURE OF INVENTION

Compared to side-by-side patterning, high definition can be easily achieved by a white-CF method because a plurality of light-emitting elements shares one light-emitting layer. Further, higher definition can be achieved by adoption of a top emission structure with which a high aperture ratio can be easily achieved compared to the case of a bottom emission structure. Thus, it can be said that combination of a white-CF method and a top emission structure (hereinafter referred to as a white-CF top emission structure) is a display method that is suitable for display market where high definition is still demanded.

In addition, in the light-emitting device with such a white-CF top emission structure, when a light-emitting element which emits white light is added to light-emitting elements which emit three-color light, i.e., red light, green light, and blue light, power consumption can also be reduced. However, disadvantages might occur in that white light is colored, the viewing angle dependence is large, and the like.

In the top emission structure, an upper electrode needs to be formed of a light-transmitting member because light is extracted from the upper electrode side of the light-emitting element. However, a transparent conductive film typified by ITO has high resistance among conductive materials used as an electrode material; thus, the upper electrode is generally formed using a combination of the transparent conductive film and a metal thin film with low resistance. This is necessary for large-sized displays.

The metal thin film is formed to be thin enough to have a light-transmitting property; however, the metal thin film reflects part of light. Thus, the upper electrode serves as a semi-transmissive and semi-reflective electrode. Accordingly, in the light-emitting element having such a structure, a microcavity structure is necessarily formed with a reflective electrode that is a lower electrode and a semi-transmissive and semi-reflective electrode that is an upper electrode.

In the case of light emission of red, green, or blue color, optical path length between the upper electrode and the lower electrode is adjusted so that emission wavelength of the corresponding color is strengthened; therefore, both front luminance and color purity can be improved. However, in the case of white light emission, there is a problem that it is difficult to obtain white light emission when a specific emission wavelength is strengthened.

In the case of light emission of a single color such as red, green, or blue, viewing angle dependence can be suppressed by using a color filter. On the other hand, in the case of white light emission, viewing angle dependence is large because a color filter cannot be used, and color shift occurs when an image is viewed from an oblique direction.

One embodiment of the present invention is to provide a light-emitting device which can emit monochromatic light with high purity due to a microcavity effect and which can emit white light in the case of a combination of monochromatic light. Further, one embodiment of the present invention is to provide a light-emitting device which can emit monochromatic light with high purity due to a microcavity effect and which can emit white light with small viewing angle dependence in the case of a combination of monochromatic light. Further, one embodiment of the present invention is to provide a high-definition light-emitting device. Further, another embodiment of the present invention is to provide a light-emitting device with low power consumption. Furthermore, another embodiment of the present invention is to provide a high-definition electronic device and a lighting device. Another embodiment of the present invention is to provide an electronic device and a lighting device with low power consumption. Another embodiment of the present invention is to provide a novel light-emitting device, a novel lighting device, or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

MEANS FOR SOLVING THE PROBLEMS

One embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. The EL layer includes a first light-emitting substance which emits blue light and a second light-emitting substance which emits light corresponding to a complementary color of blue. An optical path length between the fourth reflective electrode and the semi-transmissive and semi-reflective electrode is set so as to relatively intensify the light corresponding to the complementary color of blue. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. The EL layer includes a first light-emitting substance which emits blue light and a second light-emitting substance which emits light having an emission spectrum peak within a range of greater than or equal to 540 nm and less than or equal to 580 nm. An optical path length between the fourth reflective electrode and the semi-transmissive and semi-reflective electrode is set so as to relatively intensify the light having the emission spectrum peak within the range of greater than or equal to 540 nm and less than or equal to 580 nm. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. The EL layer includes a first light-emitting substance which emits blue light and a second light-emitting substance which emits yellow light. An optical path length between the fourth reflective electrode and the semi-transmissive and semi-reflective electrode is set so as to relatively intensify the yellow light. The semi-transmissive and semi-reflective electrode is formed so as to cover an edge portion of the EL layer.

Another embodiment of the present invention is a light-emitting device which includes a plurality of light-emitting elements including an EL layer used in common between a reflective electrode that is formed for each light-emitting element and a semi-transmissive and semi-reflective electrode that is common to each of the light-emitting elements, in which a microcavity structure and a coloring layer (color filter) are used in combination. The EL layer includes a first light-emitting substance which emits blue light and a second light-emitting substance which emits light corresponding to a complementary color of blue. The semi-transmissive and semi-reflective electrode is formed so as to cover an edge portion of the EL layer.

Another embodiment of the present invention is a light-emitting device including a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. A fourth color filter is on a semi-transmissive and semi-reflective electrode side of the fourth light-emitting element. The EL layer includes a first light-emitting substance which emits blue light and a second light-emitting substance which emits light corresponding to a complementary color of blue. An optical path length between the fourth reflective electrode and the semi-transmissive and semi-reflective electrode is set so as to relatively intensify the light corresponding to the complementary color of blue. The semi-transmissive and semi-reflective electrode is formed so as to cover an edge portion of the EL layer.

Another embodiment of the present invention is a light-emitting device including a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. A fourth color filter is on a semi-transmissive and semi-reflective electrode side of the fourth light-emitting element. The EL layer includes a first light-emitting substance which emits blue light and a second light-emitting substance which emits light having an emission spectrum peak within a range of greater than or equal to 540 nm and less than or equal to 580 nm. An optical path length between the fourth reflective electrode and the semi-transmissive and semi-reflective electrode is set so as to relatively intensify the light having the emission spectrum peak within the range of greater than or equal to 540 nm and less than or equal to 580 nm. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is on a semi-transmissive and semi-reflective electrode side of the first light-emitting element. A second color filter is on a semi-transmissive and semi-reflective electrode side of the second light-emitting element. A third color filter is on a semi-transmissive and semi-reflective electrode side of the third light-emitting element. A fourth color filter is on a semi-transmissive and semi-reflective electrode side of the fourth light-emitting element. The EL layer includes a first light-emitting substance which emits blue light and a second light-emitting substance which emits yellow light. An optical path length between the fourth reflective electrode and the semi-transmissive and semi-reflective electrode is set so as to relatively intensify the yellow light. The semi-transmissive and semi-reflective electrode is formed so as to cover an edge portion of the EL layer.

In any of the above structures, the first light-emitting element emits red light, the second light-emitting element emits green light, and the third light-emitting element emits blue light.

In any of the above structures, the first light-emitting substance has an emission spectrum peak within a range of greater than or equal to 420 nm and less than or equal to 480 nm.

In any of the above structures, the second light-emitting substance has an emission spectrum peak within a range of greater than or equal to 540 nm and less than or equal to 580 nm.

In any of the above structures, the optical path length between the first reflective electrode and the semi-transmissive and semi-reflective electrode is set so as to relatively intensify red light, the optical path length between the second reflective electrode and the semi-transmissive and semi-reflective electrode is set so as to relatively intensify green light, and the optical path length between the third reflective electrode and the semi-transmissive and semi-reflective electrode is set so as to relatively intensify blue light.

One embodiment of the present invention also includes, in its scope, an electronic device and a lighting device each including the light-emitting device described in any of the above structures. The light-emitting device in this specification refers to an image display device and a light source (e.g., a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a light-emitting element by a chip on glass (COG) method.

According to one embodiment of the present invention, provided is a light-emitting device which can emit monochromatic light with high purity due to a microcavity effect and which can emit white light in the case of a combination of monochromatic light. Further, according to one embodiment of the present invention, provided is a light-emitting device which can emit monochromatic light with high purity due to a microcavity effect and which can emit white light with small viewing angle dependence in the case of a combination of monochromatic light. Further, in one embodiment of the present invention, a high-definition light-emitting device can be provided. Further, in one embodiment of the present invention, a light-emitting device with low power consumption can be provided. Furthermore, in one embodiment of the present invention, a high-definition electronic device and a lighting device can be provided. In one embodiment of the present invention, an electronic device and a lighting device with low power consumption can be provided. In one embodiment of the present invention, a novel electronic device or a novel lighting device can be provided. Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 4A, 4B, 4C, 4D, 4D1, and 4D2 illustrate electronic devices.

BEST MODE FOR CARRYING OUT THE INVENTION

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Embodiment 1

In this embodiment, a light-emitting element included in a light-emitting device that is one embodiment of the present invention is described.

The light-emitting element described in this embodiment has a structure in which an EL layer including a light-emitting layer is provided between a pair of electrodes. Note that a single EL layer may be included in the light-emitting element; alternatively, EL layers may be stacked with a charge generation layer provided therebetween. In this embodiment, a tandem structure in which two EL layers are stacked is described with reference to FIG. 1.

Figure 1:
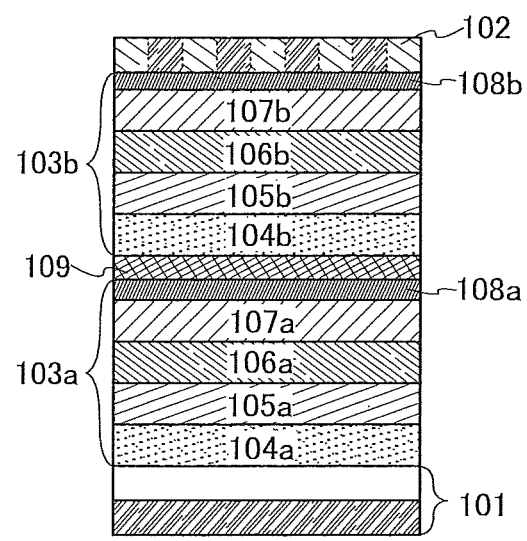
FIG. 1 illustrates a structure of a light-emitting element.

The light-emitting element illustrated in FIG. 1 has a structure in which two EL layers (103a and 103b) each including a light-emitting layer are provided between a pair of electrodes (first electrode 101 and second electrode 102). In the EL layer 103a, a hole-injection layer 104a, a hole-transport layer 105a, a light-emitting layer 106a, an electron-transport layer 107a, an electron-injection layer 108a, and the like are sequentially stacked over the first electrode 101. In the EL layer 103b, a hole-injection layer 104b, a hole-transport layer 105b, a light-emitting layer 106b, an electron-transport layer 107b, an electron-injection layer 108b, and the like are sequentially stacked over the first electrode 101. A charge generation layer 109 is provided between the EL layer 103a and the EL layer 103b.

The EL layers included in the light-emitting element used in the light-emitting device of one embodiment of the present invention each include at least a light-emitting substance which exhibits blue light emission and a light-emitting substance which exhibits yellow light emission. Thus, in the case of the light-emitting element having a tandem structure illustrated in FIG. 1, a light-emitting substance exhibiting blue light emission is included in one of the light-emitting layers 106a and 106b, and a light-emitting substance exhibiting yellow light emission is included in the other of the light-emitting layers 106a and 106b. Other substances may be combined with the above substances as appropriate. Further, each of blue and yellow light emission may be either fluorescence or phosphorescence. Furthermore, in the case of a light-emitting element including a single EL layer without an intermediate layer, a structure may be employed in which a light-emitting layer including at least a light-emitting substance which emits blue light and a light-emitting layer including at least a light-emitting substance which emits yellow light are directly stacked; alternatively, a structure may be employed in which a light-emitting layer includes a light-emitting substance which exhibits blue light and a light-emitting substance which exhibits yellow light.

The charge generation layer 109 has a function of injecting electrons into one of the EL layers (103a or 103b) and injecting holes into the other of the EL layers (103b or 103a) when a voltage is applied between the first electrode 101 and the second electrode 102. Thus, in FIG. 1, when a voltage is applied such that the potential of the first electrode 101 is higher than that of the second electrode 102, the charge-generation layer 109 injects electrons into the EL layer 103a and injects holes into the EL layer 103b.

Note that in terms of light extraction efficiency, the charge-generation layer 109 preferably has a light-transmitting property with respect to visible light (specifically, the charge-generation layer 109 has a visible light transmittance of 40% or more). The charge generation layer 109 functions even if it has lower conductivity than the first electrode 101 or the second electrode 102.

In the light-emitting element illustrated in FIG. 1, light emitted in all directions from the light-emitting layers (106a and 106b) included in the EL layers (103a and 103b) can be resonated by the first electrode (reflective electrode) 101 and the second electrode (semi-transmissive and semi-reflective electrode) 102 which function as a micro optical resonator (microcavity). Light is emitted through the second electrode 102. The first electrode 101 is a reflective electrode, which has a stacked structure of a reflective conductive material and a transparent conductive material. Optical adjustment thereof is performed by controlling the thickness of the transparent conductive film. The optical adjustment may be performed by controlling the thickness of the hole-injection layer 104a included in the EL layer 103a.

As described above, the optical adjustment is performed by controlling the thicknesses of the first electrode 101 or the hole-injection layer 104a, whereby spectra of a plurality of light obtained from the light-emitting layers (106a and 106b) can be narrower, and light emission with high color purity can be obtained.

Note that by the microcavity structure formed with the first electrode (reflective electrode) 101 and the second electrode (semi-transmissive and semi-reflective electrode) 102, the light-emitting layers (106a and 106b) emit blue light (e.g., with an emission spectrum peak in the range of 400 nm to 480 nm, preferably in the range of 450 nm to 470 nm), green light (e.g., with an emission spectrum peak in the range of 500 nm to 560 nm, preferably 520 nm to 555 nm), red light (e.g., with an emission spectrum peak in the range of 580 nm to 680 nm, preferably 600 nm to 620 nm), or yellow light (also including yellow-green and orange light) (e.g., with an emission spectrum peak in the range of 540 nm to 600 m, preferably 540 nm to 580 nm). Further, specific combinations of emission colors of the light-emitting substances used for the light-emitting layers 106a and 106b (106a/106b) are given below. "Blue/yellow", "yellow/blue", "blue/yellow•blue", "blue/blue•yellow", "blue•yellow/blue", "blue•yellow/yellow", "yellow/yellow•blue", "yellow/blue•yellow", "yellow•blue/blue" and "yellow•blue/yellow".

The above-described light-emitting element is combined with a coloring layer (color filter) corresponding to an emission color extracted utilizing a microcavity effect, whereby an emission spectrum of each emission color can be made even narrower.

Next, a specific example in manufacturing the above light-emitting element is described.

The first electrode 101 is a reflective electrode and thus is formed of a conductive material having reflectivity, and a film whose visible light reflectivity is greater than or equal to 40% and less than or equal to 100%, preferably greater than or equal to 70% and less than or equal to 100%, and resistivity is $1\times10^{-2}$ Ωcm or lower is used. The semi-transmissive and semi-reflective electrode 102 is founed using a conductive material having reflectivity and a conductive material having a light-transmitting property, and a film whose visible light reflectivity is greater than or equal to 20% and less than or equal to 80%, preferably greater than or equal to 40% and less than or equal to 70%, and whose resistivity is $1\times10^{-2}$ Ωcm or lower is used.

The optical path length between the first electrode 101 and the second electrode 102 is adjusted in accordance with a wavelength of desired light so that light with a desired wavelength can be resonated and strengthened. Specifically, the thickness of the transparent conductive film used for part of the first electrode 101 is changed so that the optical path length between the electrodes is m $\lambda/2$ (m is a natural number) to the wavelength $\lambda$ of desired light.

Further, the optical path length between the first electrode 101 and the light-emitting layer is adjusted in order to amplify light with the desired wavelength. To be more specific, the thickness of the transparent conductive film used for part of the first electrode 101 or the thickness of an organic film forming the hole-injection layer 104a is changed so that the optical path length between the first electrode 101 and the light-emitting layer is $(2m'+1)\lambda/4$ (m is a natural number) to the wavelength $\lambda$ of desired light. Note that in the case where two light-emitting layers are provided apart from each other as a tandem light-emitting element and light emissions at different wavelengths are obtained from the light-emitting layers, the optical path length is set between the first electrode 101 and either of the light-emitting layers, which emits light with a desired wavelength $\lambda$ more strongly.

In that case, the optical path length between the first electrode 101 and the second electrode 102 is, to be exact, represented by the product of a refractive index and a film thickness from a reflective region in the first electrode 101 to a reflective region in the second electrode 102. However, it is difficult to exactly determine the reflective regions in the first electrode 101 and the second electrode 102; thus, it is assumed that the above effect can be sufficiently obtained wherever the reflective regions may be set in the first electrode 101 and the second electrode 102. Further, the optical path length between the first electrode 101 and the light-emitting layer emitting desired light is, to be exact, the optical length between the reflective region in the first electrode 101 and the light-emitting region in the light-emitting layer emitting desired light. However, it is difficult to exactly determine the reflective region in the first electrode 101 and the light-emitting region in the light-emitting layer emitting desired light; thus, it is assumed that the above effect can be sufficiently obtained wherever the reflective region and the light-emitting region may be set in the first electrode 101 and the light-emitting layer emitting desired light.

Any of metals, alloys, electrically conductive compounds, mixtures thereof, and the like can be used as appropriate for materials for forming the first electrode 101 and the second electrode 102 which satisfy the above condition. Specifically, indium oxide-tin oxide (indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The first electrode 101 and the second electrode 102 can be formed by, for example, a sputtering method or an evaporation method (including a vacuum evaporation method).

The hole-injection layers 104a and 104b inject holes through the electrode into the hole-transport layers 105a and 105b with a high hole-transport property, each of which contain a hole-transport material and an acceptor substance. The hole-injection layers 104a and 104b each contain a hole-transport material and an acceptor substance, so that electrons are extracted from the hole-transport material by the acceptor substance to generate holes and the holes are injected into the hole-transport layers 105a and 105b. The hole-transport layers 105a and 105b are formed using hole-transport materials.

Specific examples of the hole-transport materials used for the hole-injection layers 104a and 104b and the hole-transport layers 105a and 105b include aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). These materials described here mainly are substances each having a hole mobility of greater than or equal to $10^{-6}$ cm$^2$/(V·s). However, besides the above materials, others may be used as long as the material has a higher hole transport property than an electron transport property.

Further, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD) can be used.

Examples of the acceptor substance used for the hole-injection layers 105a and 105b include oxides of metals belonging to Group 4 to 8 of the periodic table. Specifically, molybdenum oxide is particularly preferable.

The light-emitting layers 106a and 106b contain light-emitting substances. Note that the light-emitting layers 106a and 106b each contain one or both of an electron-transport material and a hole-transport material in addition to the light-emitting substance.

Light-emitting substances that convert singlet excitation energy into luminescence or light-emitting substances that converts triplet excitation energy into luminescence can be used for the light-emitting substances which can be used for the light-emitting layers 106a and 106b. Described below are examples of the light-emitting substances.

Examples of the light-emitting substances that convert singlet excitation energy into luminescence include substances that emit fluorescence. For example, substances which exhibit blue light emission (emission wavelength: 400 nm to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenylpyrene-1,6-diamine (abbreviation: 1,6FLPAPrn), and N,N'-bis(3-methylphenyl)-N,N'-bis[3-(9-phenyl-9H-fluoren-9-yl)phenyl]pyrene-1,6-diamine (abbreviation: 1,6mMemFLPAPrn), substances which exhibit yellow light emission (emission wavelength: 540 nm to 580 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2) can be used.

Examples of the light-emitting substances that convert triplet excitation energy into luminescence include substances that emit phosphorescence. For example, substances which exhibit blue light emission (emission wavelength: 400 nm to 480 nm) such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), Tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris[3-(5-biphenyl)-5-isopropyl-4-phenyl-4H-1,2,4-triazolato]iridium(III) (abbreviation: Ir(iPr5btz)$_3$), tris[3-methyl-1-(2-methylphenyl)-5-phenyl-1H-1,2,4-triazolato]iridium(III) (abbreviation: Ir(Mptz1-mp)$_3$), tris[1-methy-5-phenyl-3-propyl-1H-1,2,4-triazolato]iridium(III) (abbreviation: Ir(Prptz1-Me)$_3$), fac-tris[1-(2,6-diisopropylphenyl)-2-phenyl-1H-imidazole]iridium(III) (abbreviation: Ir(iPrpmi)$_3$), and tris[3-(2,6-dimethylphenyl)-7-methylimidazo[1,2-f]phenanthridinato]iridium(III) (abbreviation: Ir(dmpimpt-Me)$_3$), and substances which exhibit yellow light emission (emission wavelength: 540 nm to 580 nm such as (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium (III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl- 6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$) iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III)acetylacetonate (abbreviation: Ir(bt)$_2$(acac)) can be used.

As the electron-transport materials used for the light-emitting layers 106a and 106b, π-electron deficient heteroaromatic compounds such as a nitrogen-containing heteroaromatic compound are preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f, h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As the hole-transport materials used for the light-emitting layers 106a and 106b, π-electron rich heteroaromatic compounds (e.g., carbazole derivatives or indole derivatives) or aromatic amine compounds are preferable, examples of which include 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

The electron-transport layers 107a and 107b are layers containing substances with high electron-transport properties. For the electron-transport layers 107a and 107b, metal complexes such as Alq$_3$, tris(4-methyl-8-quinolinolato)aluminum (abbreviation: Almq$_3$), bis(10-hydroxybenzo[h]quinolinato)beryllium(II) (abbreviation: BeBq$_2$), BAlq, Zn(BOX)$_2$, and bis[2-(2-hydroxyphenyl)benzothiazolato]zinc(II) (abbreviation: Zn(BTZ)$_2$) can be used. Moreover, beteroaromatic compounds such as 2-(4-biphenylyl)-5-(4-tert-butylphenyl)-1,3,4-oxadiazole (abbreviated designation: PBD), 1,3-bis[5-(p-tert-butylphenyl)-1,3,4-oxadiazol-2-yl]benzene (abbreviated designation: OXD-7), 3-(4-tert-biphenylyl)-4-phenyl-5-(4-butylphenyl)-1,2,4-triazole (abbreviated designation: TAZ), 3-(4-tert-butylphenyl)-4-(4-ethylphenyl)-5-(4-biphenylyl)-1,2,4-triazole (abbreviated designation: p-EtTAZ), bathophenanthroline (abbreviated designation: Bphen), bathocuproine (abbreviated designation: BCP), 4-4'-bis(5-methylbenzoxazol-2-yl)stilbene abbreviated designation: BzOs), and the like can be used, as well. Further alternatively, it is possible to use high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy). The substances mentioned here are mainly substances each having an electron mobility of 1×10$^{-6}$ cm$^2$/Vs or higher. However, substances other than the above-described substances may also be used for the electron-transport layers 107a and 107b as long as the electron-transport property is higher than the hole-transport property.

Each of the electron-transport layers 107a and 107b is not limited to a single layer but may be a stack including two or more layers containing any of the above substances.

The electron-injection layers 108a and 108b are layers containing substances with high electron-injection properties. For each of the electron-injection layers 108a and 108b, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. An electride may also be used for the electron-injection layer 108. Examples of the electride include a substance in which electrons are added at high concentration to calcium oxide-aluminum oxide. Any of the substances for forming the electron-transport layers 107a and 107b, which are given above, can be used.

The electron-injection layers 108a and 108b each may be formed using a composite material in which an organic compound and an electron donor are mixed. The composite material is superior in an electron-injection property and an electron-transport property, since electrons are generated in the organic compound by the electron donor. The organic compound here is preferably a material excellent in transporting the generated electrons; specific examples include substances for forming the electron-transport layers 107a and 107b (e.g., metal complexes or heteroaromatic compounds), which are described above. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Further, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The charge-generation layer 109 may have either a structure in which an electron acceptor (acceptor) is added to a hole-transport material or a structure in which an electron donor (donor) is added to an electron-transport material. Alternatively, both of these structures may be stacked.

In the case of the structure in which an electron acceptor is added to a material with a high hole-transport property, as the material with a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. These materials described here mainly are substances having a hole mobility of greater than or equal to $10^{-6}$ cm$^2$/(V·s). However, substances other than the above substances may be used as long as they are organic compounds having a hole-transport property higher than an electron-transport property.

Further, as the electron acceptor, 7,7,8,8-tetracyano-2,3,5,6-tetrafluoroquinodimethane (abbreviation: F$_4$-TCNQ), chloranil, and the like can be given. Moreover, an oxide of metals belonging to Groups 4 to 8 of the periodic table can be used. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

On the other hand, in the case of the structure in which an electron donor is added to an electron-transport material, as the electron-transport material, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Besides the metal complexes, PBD, OXD-7, TAZ, Bphen, BCP, or the like can also be used. The substances described here are substances each having an electron mobility of greater than or equal to $10^{-6}$ cm$^2$/(V·s). Note that other than these substances, any organic compound that has an electron-transport property higher than a hole-transport property may be used.

As the electron donor, it is possible to use an alkali metal, an alkaline earth metal, a rare earth metal, a metal belonging to Group 2 or 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

Note that by the formation of the charge generation layer 109 using a material described above, it is possible to suppress an increase in driving voltage caused by stacking the EL layers.

The hole-injection layers 104a and 104b, the hole-transport layers 105a and 105b, the light-emitting layers 106a and 106b, the electron-transport layers 107a and 107b, the electron-injection layers 108a and 108b, and the charge generation layer 109 can be formed by any of the following method: an evaporation method (including a vacuum evaporation method), a printing method (such as gravure printing, offset printing, screen printing, or inkjet printing), a coating method, and the like.

Although the light-emitting element having two EL layers is described in this embodiment, a light-emitting element in which three or more EL layers are stacked can also be used. Using such a tandem light-emitting element, a low power consumption light-emitting device which can be driven at low voltage can be realized.

The light-emitting element described in this embodiment has a microcavity structure, in which light rays (monochromatic light rays) with different wavelengths can be extracted from the same EL layer, so that side-by-side patterning (e.g., for RIB) is not needed. Therefore, the above structure is advantageous for full color display owing to easiness in achieving high definition display or the like. Further, by combination of the light-emitting element and the coloring layer (color filter), viewing angle dependence can be reduced. This structure is particularly useful in the case of being used for a color display (image display device) including pixels of three or more colors but may also be used for a lighting device or the like.

As a light-emitting device including the above-described light-emitting element, a passive matrix light-emitting device and an active matrix light-emitting device can be fabricated. Each of the light-emitting devices is one embodiment of the present invention.

Note that there is no particular limitation on the structure of the transistor (FET) in the case of fabricating the active matrix light-emitting device. For example, a staggered FET or an inverted staggered FET can be used as appropriate. Further, a driver circuit formed over an FET substrate may be formed using either an n-channel FET or a p-channel FET or both. Furthermore, there is no particular limitation on the crystallinity of a semiconductor film used for the FET. For example, either an amorphous semiconductor film or a crystalline semiconductor film may be used. Examples of a semiconductor material include Group 13 semiconductors (e.g., gallium), Group 14 semiconductors (e.g., silicon), compound semiconductors (including oxide semiconductors), and organic semiconductors.

Further, the light-emitting element described in this embodiment can be formed over a variety of substrates. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include a barium borosilicate glass substrate, an aluminoborosilicate glass substrate, and a soda lime glass substrate. Examples of the flexible substrate, the attachment film, the base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

When a transistor is formed together with the light-emitting element over any of these substrates, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption of the circuit or higher integration of the circuit.

When the above-described flexible substrate is used as a substrate over which a light-emitting element or a transistor is provided, the light-emitting element or the transistor may be directly formed over the flexible substrate. Alternatively, part of or the entire light-emitting element or the transistor may be formed over a base substrate with a separation layer provided therebetween and then the light-emitting element or the transistor may be separated from the base substrate and transferred to another substrate. By this separation and transfer method with a separation layer, the light-emitting element or the transistor can be formed over a substrate having low heat resistance or a flexible substrate having difficulty in direct formation of the light-emitting element or the transistor over that. For the above separation layer, a stack including inorganic films, which are a tungsten film and a silicon oxide film, or an organic resin film of polyimide or the like formed over a substrate can be used, for example. Examples of a substrate to which a transistor is transferred include, in addition to the above-described substrates over which a transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of any of these substrates, increase in durability or heat resistance, and reduction in weight or thickness can be achieved.

Note that the structure described in this embodiment can be combined as appropriate with any of the structures described in the other embodiments.

Embodiment 2

In this embodiment, one embodiment of a light-emitting device in which the light-emitting element described in Embodiment 1 is combined with a coloring layer (color filter or the like) is described. In this embodiment, a structure of a pixel portion of the light-emitting device is described with reference to FIG. 2 and FIG. 7.

Figure 2:
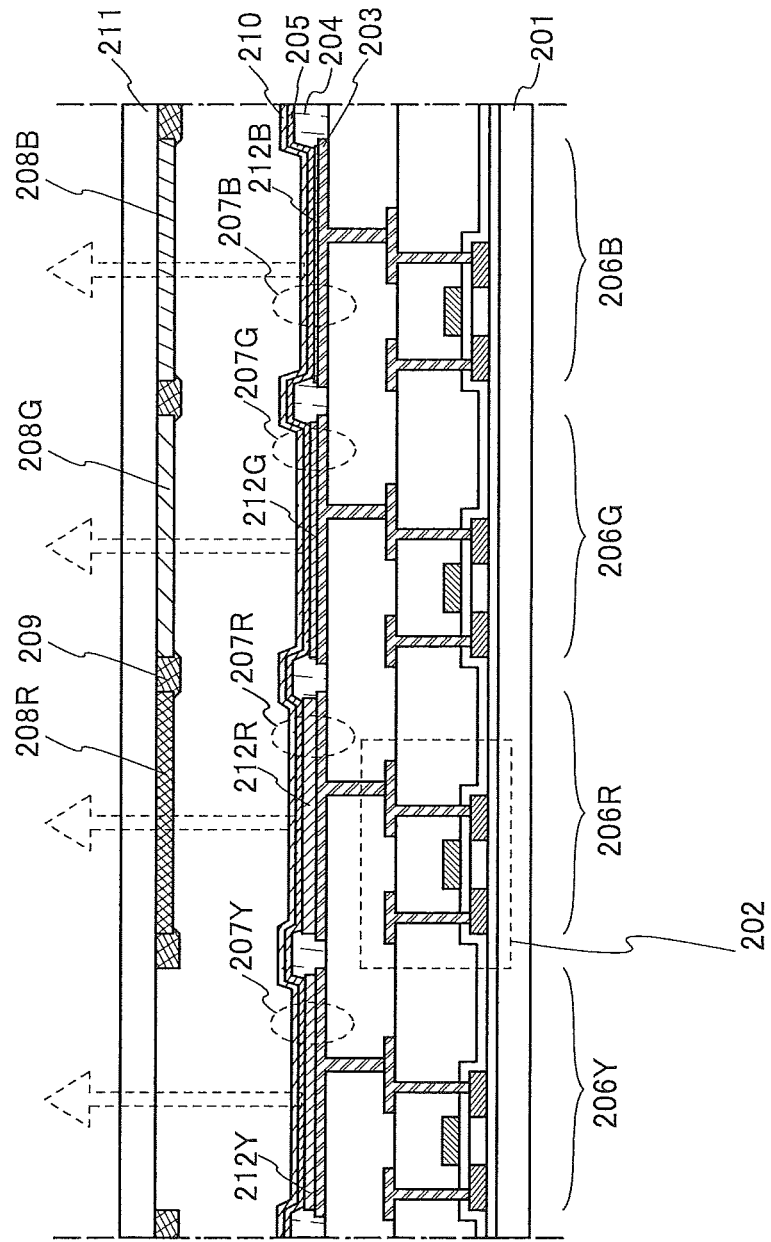
FIG. 2 illustrates a structure of a pixel portion of a light-emitting device.

In FIG. 2, a plurality of FETs 202 is formed over a substrate 201. Each of the FETs 202 is electrically connected to a light-emitting element (207R, 207G, 207B, or 207Y). In particular, each of the FETs 202 is electrically connected to a first electrode 203 that is a pixel electrode of the light-emitting element. A partition wall 204 is provided so as to cover edge portions of adjacent first electrodes 203.

The structure of the first electrode 203 in this embodiment is the same as that described in Embodiment 1 and the first electrode 203 has a function as a reflective electrode. Conductive films (212B, 212G, 212R, and 212Y) which are transparent conductive films are formed over the respective first electrodes 203. The thicknesses of conductive films (212B, 212G, 212R, and 212Y) are each adjusted so that the optical path length between the first electrode 203 and the second electrode 210 of each light-emitting element (207R, 207G, 207B, or 207Y) matches a wavelength of light which is desired to be extracted. However, in optical adjustment, formation of the conductive film is not necessary in some cases. Further, an EL layer 205 is formed over the first electrode 203 and the conductive film (212B, 212G, 212R, or 212Y), and the second electrode 210 is formed over the EL layer 205. The structures of the EL layer 205 and the second electrode 210 are the same as those described in Embodiment 1. The EL layer includes a plurality of light-emitting substances each exhibit different emission colors. The second electrode 210 is an electrode which functions as a semi-transmissive and semi-reflective electrode.

Figure 7:
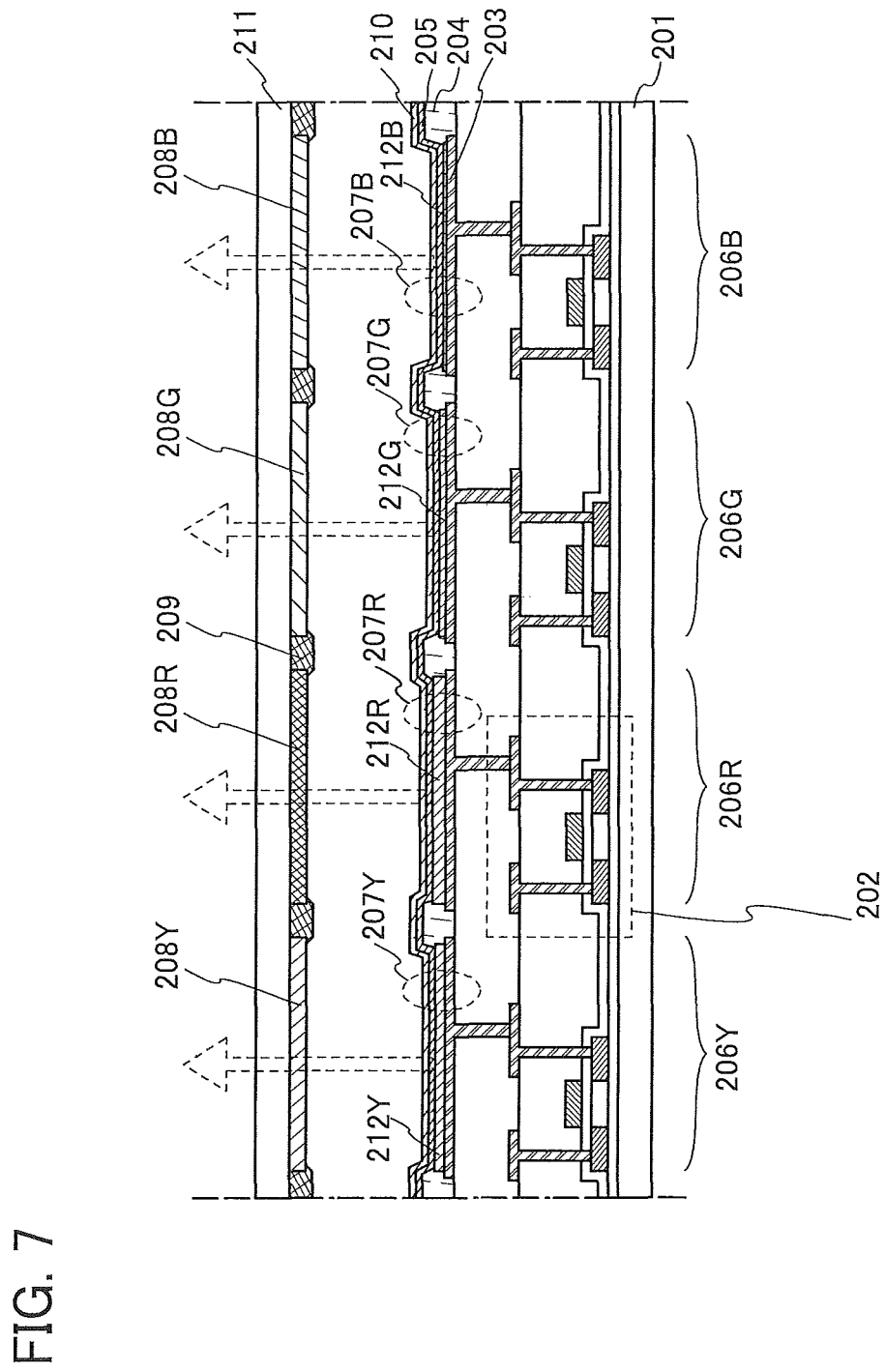
FIG. 7 illustrates a structure of a pixel portion of a light-emitting device.

The light-emitting elements 207R, 207G, 207B, and 207Y emit light with different emission spectra. In particular, the light-emitting element 207R is optically adjusted to emit red light, and in a region indicated by 206R, red light is emitted through a coloring layer 208R in the direction indicated by an arrow. In addition, the light-emitting element 207G is optically adjusted to emit green light, and in a region indicated by 206G, green light is emitted through a coloring layer 208G in the direction indicated by an arrow. The light-emitting element 207B is optically adjusted to emit blue light, and in a region indicated by 206B, blue light is emitted through a coloring layer 208B in the direction indicated by an arrow. The light-emitting element 207Y is optically adjusted to emit yellow light, and in a region indicated by 206Y, yellow light is emitted in the direction indicated by an arrow. Note that also in FIG. 7, the light-emitting element 207Y is optically adjusted to emit yellow light. As illustrated in FIG. 7, in a region indicated by 206Y, yellow light may be emitted through a coloring layer 208Y in the direction indicated by an arrow.

As shown in FIG. 2 and FIG. 7, each of the coloring layers 208R, 208G, 208B, and 208Y is provided on a transparent sealing substrate 211 that is provided above the substrate 201 over which light emitting elements 207R, 207G, 207B, and 207Y are formed. Note that the coloring layers 208R, 208G, 208B, and 208Y are provided in positions overlapping with the corresponding light-emitting elements 207R, 207G, 207B, and 207Y which exhibit different emission colors. As illustrated in FIG. 2, in a structure in which a coloring layer is not provided for the light-emitting element 207Y, a light-emitting device with particularly high emission efficiency can be obtained, and in a structure in which the coloring layer 208Y is provided for the light-emitting element 207Y, a light-emitting device with small viewing angle dependence and high emission efficiency can be obtained.

In addition, a black layer (black matrix) 209 may be provided so as to cover edge portions of adjacent coloring layers (208R, 208G, 208B, and 208Y). Note that the coloring layers 208R, 208G, 208B, and 208Y and the black layer 209 may be covered with an overcoat layer that is formed using a transparent material.

The above-described light-emitting device has a structure in which light is extracted from the sealing substrate 211 side (a top emission structure). Thus, though a light-shielding substrate or a transparent substrate can be used for the substrate 201, a light-shielding substrate is more preferable.

According to the above-described structure, a light-emitting device which includes light-emitting elements exhibiting different emission colors (red, blue, green, and yellow), which also emits white light with high efficiency by combination of these emission colors can be obtained.

Embodiment 3

In this embodiment, as an example of a light-emitting device that is one embodiment of the present invention, an active matrix light-emitting device is described with reference to FIGS. 3A and 3B. Note that the light-emitting element described in Embodiment 1 can be used for the light-emitting device described in this embodiment.

Figure 3A:
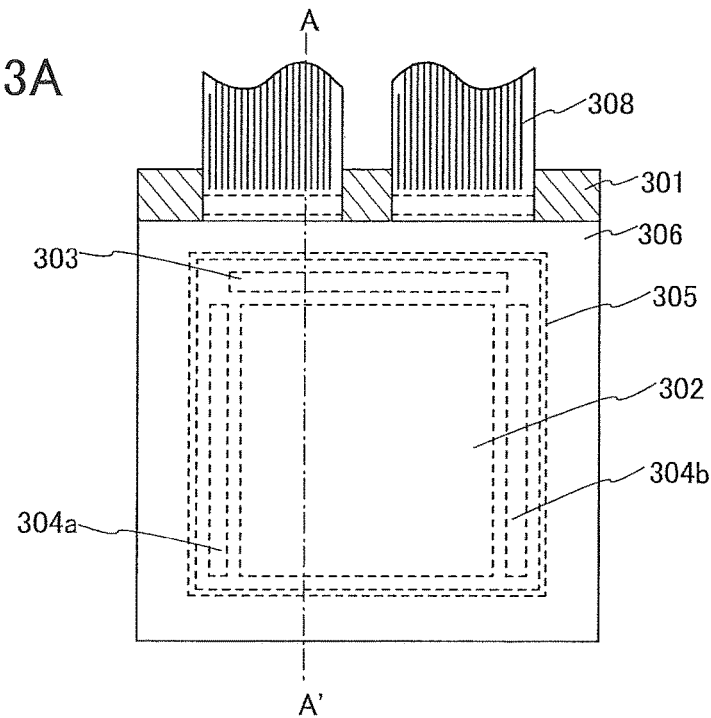
FIGS. 3A and 3B illustrate a light-emitting device.
Figure 3B:
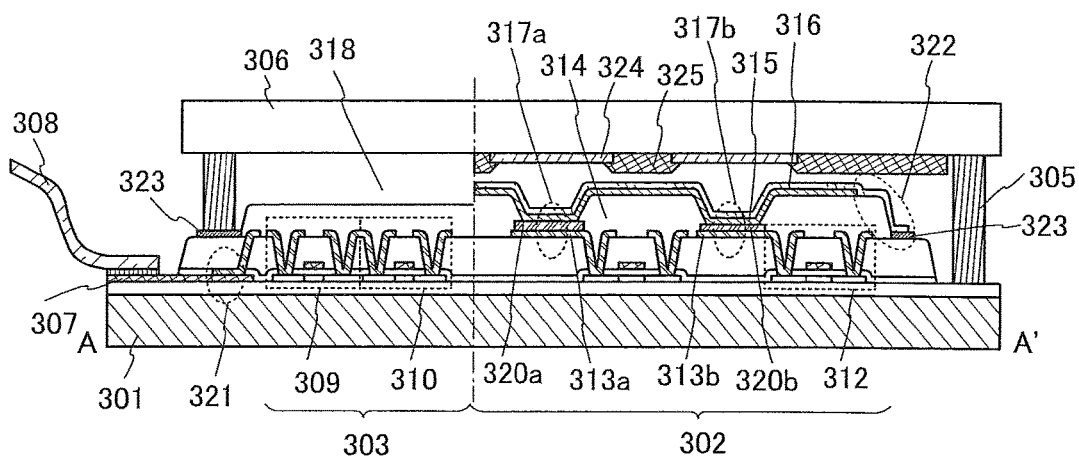

Note that FIG. 3A is a top view illustrating a light-emitting device and FIG. 3B is a cross-sectional view taken along the chain line A-A' in FIG. 3A. The active matrix light-emitting device according to this embodiment includes a pixel portion 302 provided over an element substrate 301, a driver circuit portion (a source line driver circuit) 303, and driver circuit portions (gate line driver circuits) 304a and 304b. The pixel portion 302, the driver circuit portion 303, and the driver circuit portions 304a and 304b are sealed between the element substrate 301 and a sealing substrate 306 with a sealant 305.

In addition, over the element substrate 301, a lead wiring 307 for connecting an external input terminal, through which a signal (e.g., a video signal, a clock signal, a start signal, a reset signal, or the like) or an electric potential is transmitted to the driver circuit portion 303 and the driver circuit portion 304, is provided. Here is shown an example in which a flexible printed circuit (FPC) 308 is provided as the external input terminal. Although only the FPC is shown here, the FPC may be provided with a printed wiring board (PWB). The light emitting device in this specification includes not only a main body of the light emitting device but also the light emitting device with an FPC or a PWB attached.

Next, a cross-sectional structure will be explained with reference to FIG. 3B. The driver circuit portions and the pixel portion are formed over the element substrate 301; here are illustrated the driver circuit portion 303 which is the source line driver circuit and the pixel portion 302.

The driver circuit portion 303 is an example in which an FET 309 and an FET 310 are combined. Note that each of the FET 309 and the FET 310 included in the driver circuit portion 303 may be formed with a circuit including transistors having the same conductivity type (either an n-channel transistor or a p-channel transistor) or a CMOS circuit including an n-channel transistor and a p-channel transistor. Although a driver integrated type in which the driver circuit is formed over the substrate is described in this embodiment, the driver circuit may not necessarily be formed over the substrate, and the driver circuit can be formed outside, not over the substrate.

The pixel portion 302 includes a switching FET (not shown) and a current control FET 312, and a wiring of the current control FET 312 (a source electrode or a drain electrode) is electrically connected to first electrodes (anodes) (313a and 313b) of light-emitting elements 317a and 317b. Although the pixel portion 302 includes two FETs (the switching FET and the current control FET 312) in this embodiment, one embodiment of the present invention is not limited thereto. The pixel portion 302 may include, for example, three or more FETs and a capacitor in combination.

As the FETs 309, 310, and 312, for example, a staggered transistor or an inverted staggered transistor can be used. Examples of a semiconductor material that can be used for the FETs 309, 310, and 312 include Group 13 semiconductors (e.g., gallium), Group 14 semiconductors (e.g., silicon), compound semiconductors, oxide semiconductors, and organic semiconductors. In addition, there is no particular limitation on the crystallinity of the semiconductor material, and an amorphous semiconductor film or a crystalline semiconductor film can be used. In particular, an oxide semiconductor is preferably used for the FETs 309, 310, and 312. Examples of the oxide semiconductor include an In—Ga oxide and an In-M-Zn oxide (M is Al, Ga, Y, Zr, La, Ce, or Nd). For example, an oxide semiconductor material that has an energy gap of 2 eV or more, preferably 2.5 eV or more, further preferably 3 eV or more is used for the FETs 309, 310, and 312, so that the off-state current of the transistors can be reduced.

In addition, a conductive film 320 for optical adjustment may be stacked over the first electrode 313. For example, as illustrated in FIG. 3B, the wavelengths of light extracted from the light-emitting elements 317a and 317b are different from each other; thus, conductive films 320a and 320b are formed so that the thicknesses thereof are different from each other. A partition wall 314 formed of an insulating material is formed so as to cover an edge portions of the first electrodes (313a and 313b). In this embodiment, the partition wall 314 is formed using a positive photosensitive acrylic resin. In this embodiment, the first electrodes (313a and 313b) are used as anodes.

The partition wall 314 preferably has a curved surface with curvature at an upper end portion or a lower end portion thereof. This enables the favorable coverage of a film to be formed over the partition wall 314. The partition wall 314 can be formed using, for example, either a negative photosensitive resin or a positive photosensitive resin. The material of the partition wall 314 is not limited to an organic compound and an inorganic compound such as silicon oxide, silicon oxynitride, or silicon nitride can also be used.

An EL layer 315 and a second electrode 316 are stacked over the first electrodes (313a and 313b). In the EL layer 315, at least a light-emitting layer is provided. An edge portion of the EL layer 315 that is shared by the light-emitting elements (317a and 317b) including the first electrodes (313a and 313b), the EL layer 315, and the second electrode 316 is covered with the second electrode 316. The structure of the EL layer 315 is the same as that described in Embodiment 1.

For the first electrode 313, the EL layer 315, and the second electrode 316, any of the materials listed in Embodiment 1 can be used. The first electrodes (313a and 313b) of the light-emitting elements (317a and 317b) are electrically connected to a lead wiring 307 in a region 321, and an external signal is input to the first electrodes (313a and 313b) of the light-emitting elements (317a and 317b) through an FPC 308. Further, the second electrode 316 in the light-emitting elements (317a and 317b) is electrically connected to a lead wiring 323 in a region 322, and an external signal is input through the FPC 308 although it is not shown.

Although the cross-sectional view of FIG. 3B illustrates only two light-emitting elements 317, a plurality of light-emitting elements is arranged in matrix in the pixel portion 302 as described in Embodiment 2. Light-emitting elements that provide four kinds of colors (R, G, B, and Y) are formed in the pixel portion 302, whereby a light-emitting device capable of full color display can be obtained.

A sealing film (not shown) may be provided over the second electrode 316. The sealing film is formed by a method where the light-emitting element 317 is not damaged. For example, aluminum oxide film formed by an atomic layer deposition (ALD) method is preferably used for the sealing film. Furthermore, the sealing substrate 306 is attached to the element substrate 301 with a sealant 305, whereby a light-emitting element 317 is provided in a space 318 surrounded by the element substrate 301, the sealing substrate 306, and the sealant 305.

A coloring layer (color filter) 324 is provided for the sealing substrate 306, and black layer (black matrix) 325 is provided between adjacent coloring layers. Note that light emission obtained from the light-emitting elements 317a and 317b is extracted through the coloring layer (color filter) 324.

Note that the space 318 may be filled with an inert gas (such as nitrogen and argon) or the sealant 305.

An epoxy-based resin or glass frit is preferably used for the sealant 305. The material preferably allows as little moisture and oxygen as possible to penetrate. As the sealing substrate 306, a glass substrate, a quartz substrate, or a plastic substrate formed of fiber reinforced plastic (FRP), poly(vinyl fluoride) (PVF), polyester, acrylic, or the like can be used. In the case where glass frit is used as the sealant, the element substrate 301 and the sealing substrate 306 are preferably glass substrates for high adhesion.

As described above, an active matrix light-emitting device can be obtained. Note that a passive matrix light-emitting device using a light-emitting element with the element structure described in Embodiment 1 can be manufactured as a light-emitting device.

Note that the structure described in this embodiment can be combined as appropriate with any of the structures described in the other embodiments.

Embodiment 4

In this embodiment, examples of a variety of electronic devices that are completed using a light-emitting device according to one embodiment of the present invention will be described with reference to FIGS. 4A, 4B, 4C, 4D, 4D1, 4D2, 5A, 5B, and 5C.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

Figure 4A:
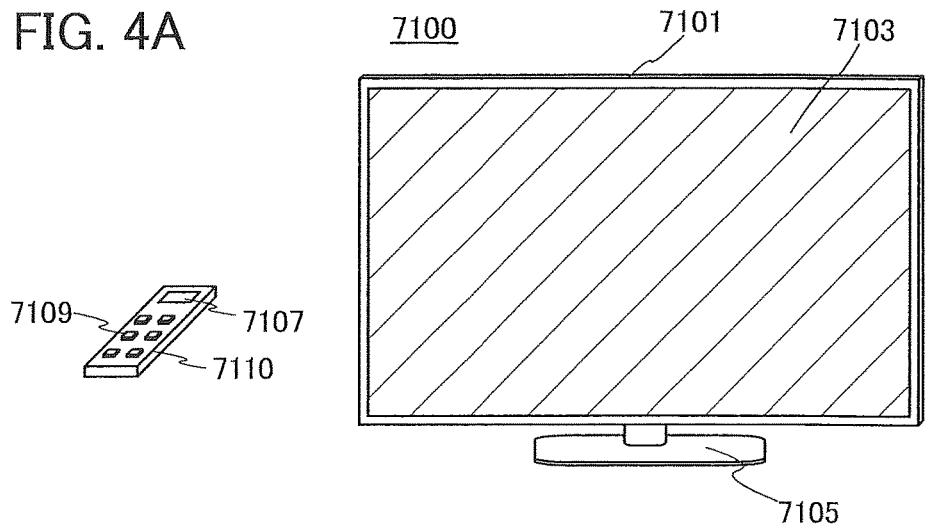

FIG. 4A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 4B:
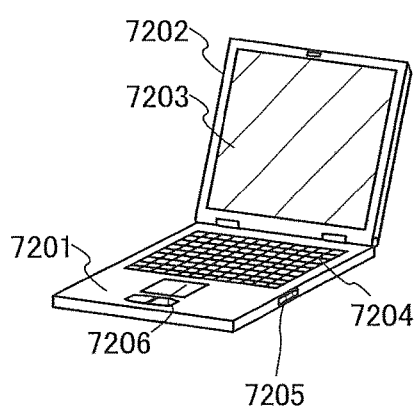

FIG. 4B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

Figure 4C:
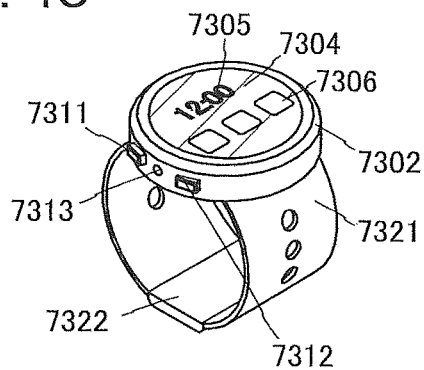

FIG. 4C illustrates a smart watch. The smart watch includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch in FIG. 4C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 4D:
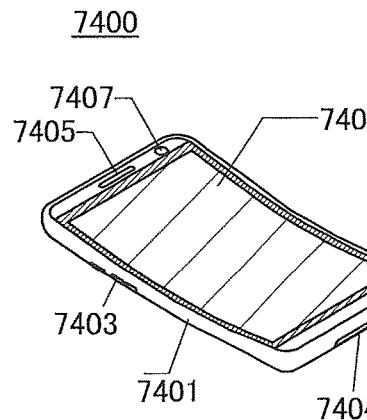
Figure 4D:
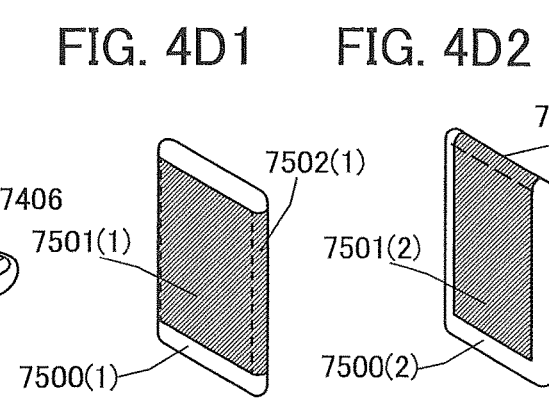

FIG. 4D illustrates an example of a mobile phone (e.g., smartphone). A mobile phone 7400 includes a housing 7401 provided with a display portion 7402, a microphone 7406, a speaker 7405, a camera 7407, an external connection portion 7404, an operation button 7403, and the like. In the case where a light-emitting device is manufactured by forming a light-emitting element of one embodiment of the present invention over a flexible substrate, the light-emitting element can be used for the display portion 7402 having a curved surface as illustrated in FIG. 4D.

When the display portion 7402 of the cellular phone 7400 illustrated in FIG. 4D is touched with a finger or the like, data can be input to the cellular phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor (e.g., a gyroscope or an acceleration sensor) is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the button 7403 of the housing 7401. The screen modes can be switched depending on the kind of images displayed on the display portion 7402. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Furthermore, the light-emitting device can be used for a mobile phone having a structure illustrated in FIG. 4D1 or FIG. 4D2, which is another structure of the mobile phone (e.g., smartphone).

Note that in the case of the structure illustrated in FIG. 4D1 or FIG. 4D2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the mobile phone is placed in user's breast pocket.

Figure 5A:
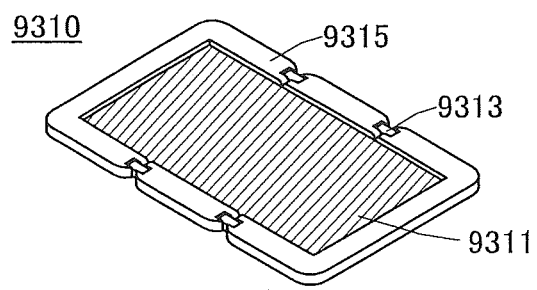
FIGS. 5A to 5C illustrate an electronic device.
Figure 5B:
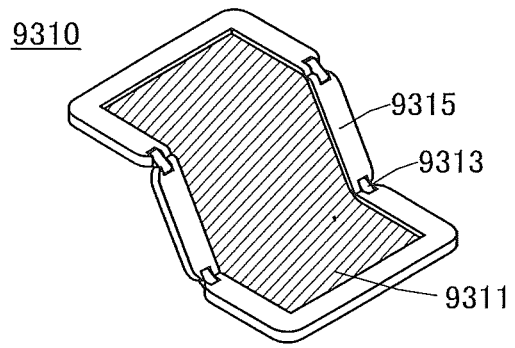
Figure 5C:
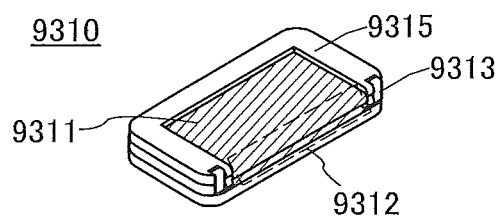

FIGS. 5A to 5C illustrate a foldable portable information terminal 9310. FIG. 5A illustrates the portable information terminal 9310 that is opened. FIG. 5B illustrates the portable information terminal 9310 that is being opened or being folded. FIG. 5C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. By folding the portable information terminal 9310 at a connection portion between two housings 9315 with the hinges 9313, the portable information terminal 9310 can be reversibly changed in shape from an opened state to a folded state. A light-emitting device of one embodiment of the present invention can be used for the display panel 9311. A display region 9312 in the display panel 9311 is a display region that is positioned at a side surface of the portable information terminal 9310 that is folded. On the display region 9312, information icons, frequently-used applications, file shortcuts to programs, and the like can be displayed, and confirmation of information and start of application can be smoothly performed.

As described above, the electronic devices can be obtained by application of the light-emitting device according to one embodiment of the present invention. Note that the light-emitting device can be used for electronic devices in a variety of fields without being limited to the electronic devices described in this embodiment.

Note that the structure described in this embodiment can be combined as appropriate with any of the structures described in the other embodiments.

Embodiment 5

In this embodiment, examples of a lighting device to which a light-emitting device according to one embodiment of the present invention is applied will be described with reference to FIG. 6.

Figure 6:
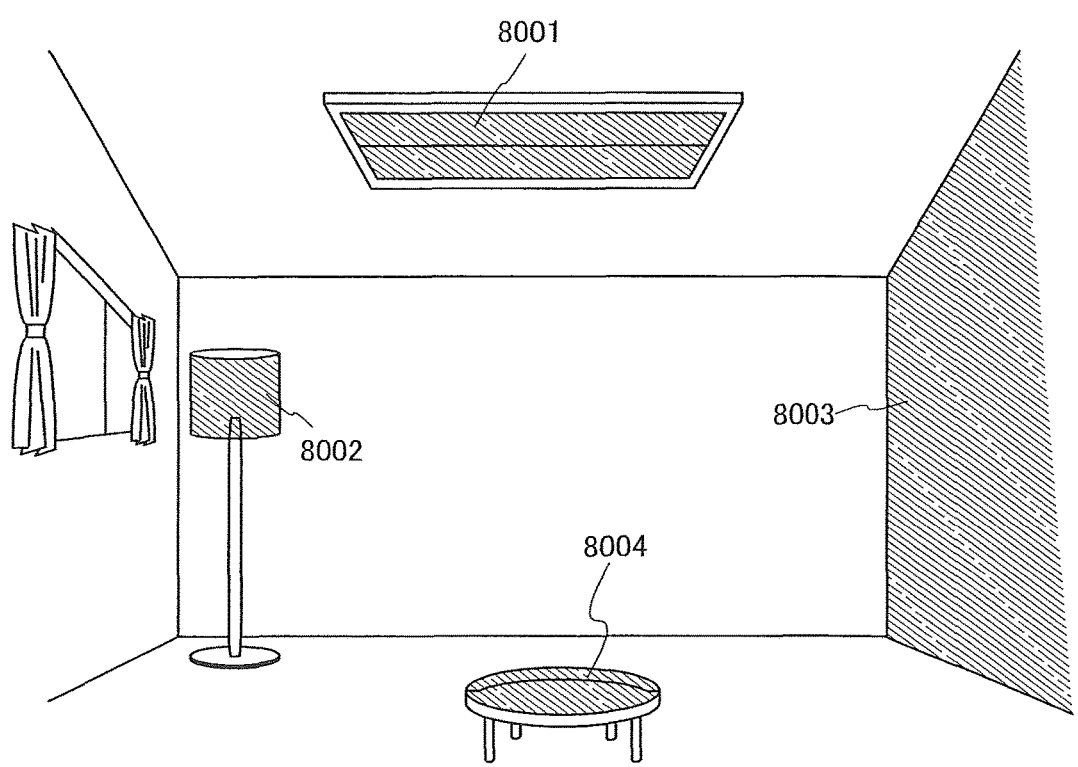
FIG. 6 illustrates lighting devices.

FIG. 6 illustrates an example in which a light-emitting device is used for an interior lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

REFERENCE NUMERALS

101: first electrode, 102: second electrode, 103$a$, 103$b$: EL layer, 104$a$, 104$b$: hole-injection layer, 105$a$, 105$b$: hole-transport layer, 106$a$: light-emitting layer, 106$b$: light-emitting layer, 107$a$, 107$b$: electron-transport layer, 108$a$, 108$b$: electron-injection layer, 109: charge generation layer, 201: substrate, 202: FET, 203:first electrode, 204: partition wall, 205: EL layer, 206R, 206G, 206B, 206Y: light-emitting region, 207R, 207G, 207B, 207Y: light-emitting element, 208R, 208G, 208B, 208Y: coloring layer, 209: black layer (black matrix), 210: second electrode, 211: sealing substrate, 212B, 212G, 212R, 212Y: conductive film, 301: element substrate, 302: pixel portion, 303: driver circuit portion (source line driver circuit), 304$a$, 304$b$: driver circuit portion (gate line driver circuit), 305: sealant, 306: sealing substrate, 307:wiring, 308: FPC(flexible printed circuit), 309: FET, 310: FET, 312: FET, 313$a$, 313$b$: first electrode, 314: partition wall, 315: EL layer, 316: second electrode, 317$a$, 317$b$: light-emitting element, 318: space, 320$a$, 320$b$: conductive film, 321: region, 322: region, 323: wiring, 324: coloring layer, 325: black layer, 7100: television device, 7101: housing, 7103: display portion, 7105: stand, 7107: display portion, 7109: operation key, 7110: remote controller, 7201: main body, 7202: housing, 720: display portion, 7204: keyboard, 7205: external connection port, 7206: pointing device, 7302: housing, 7304: display panel, 7305: icon indicating time, 7306: another icon, 7311: operation button, 7312: operation button, 7313: connection terminal, 7321: band, 7322: clasp, 7400: mobile phone, 7401: housing, 7402: display portion, 7403: operation button, 7404: external connection portion, 7405: speaker, 7406: microphone, 7407: camera, 7500(1), 7500(2): housing, 7501(1), 7501(2): first screen, 7502(1), 7502(2): second screen, 8001: interior lighting device, 8002: lighting device, 8003: lighting device, 8004: lighting device, 9310: portable information terminal, 9311: display panel, 9312: display region, 9313: hinge, 9315: housing This application is based on Japanese Patent Application serial no. 2014-044963 filed with Japan Patent Office on Mar. 7, 2014 and Japanese Patent Application serial no. 2014-045021 filed with Japan Patent Office on Mar. 7, 2014, the entire contents of which are hereby incorporated by reference.

The invention claimed is:

1. A light-emitting device comprising:
    a first light-emitting element comprising a first reflective electrode, a first transparent conductive film, an EL layer, and a semi-transmissive and semi-reflective electrode;
    a second light-emitting element comprising a second reflective electrode, a second transparent conductive film, the EL layer, and the semi-transmissive and semi-reflective electrode;
    a third light-emitting element comprising a third reflective electrode, a third transparent conductive film, the EL layer, and the semi-transmissive and semi-reflective electrode; and
    a fourth light-emitting element comprising a fourth reflective electrode, a fourth transparent conductive film, the EL layer, and the semi-transmissive and semi-reflective electrode,
    wherein the EL layer has a tandem structure which comprises:
        a first light-emitting layer including a first light-emitting substance; and
        a second light-emitting layer over the first light-emitting layer, the second light-emitting layer including a second light-emitting substance,
    wherein the first light-emitting substance exhibits one of blue light and yellow light,
    wherein the second light-emitting substance exhibits the other of blue light and yellow light,
    wherein the semi-transmissive and semi-reflective electrode covers an edge portion of the EL layer, and
    wherein the thicknesses of the first transparent conductive film, the second transparent conductive film, the third transparent conductive film, and the fourth transparent conductive film are different from one another.

2. The light-emitting device according to claim 1,
    wherein the first light-emitting substance emits fluorescence, and
    wherein the second light-emitting substance emits phosphorescence.

3. The light-emitting device according to claim 1,
    wherein the first light-emitting substance emits phosphorescence, and
    wherein the second light-emitting substance emits fluorescence.

4. The light-emitting device according to claim 1, wherein an optical path length between the fourth reflective electrode and the semi-transmissive and semi-reflective electrode is set so as to intensify yellow light.

5. The light-emitting device according to claim 1,
    wherein the first light-emitting substance has an emission spectrum peak within a range of greater than or equal to 420 nm and less than or equal to 480 nm, and
    wherein the second light-emitting substance has an emission spectrum peak within a range of greater than or equal to 540 nm and less than or equal to 580 nm.

6. The light-emitting device according to claim 1, wherein the edge portion of the EL layer includes a side surface of the EL layer.

7. The light-emitting device according to claim 1, further comprising a first flexible substrate and a second flexible substrate.

8. A light-emitting device comprising:
    a first light-emitting element comprising a first reflective electrode, a first transparent conductive film, an EL layer, and a semi-transmissive and semi-reflective electrode;
    a second light-emitting element comprising a second reflective electrode, a second transparent conductive film, the EL layer, and the semi-transmissive and semi-reflective electrode;
    a third light-emitting element comprising a third reflective electrode, a third transparent conductive film, the EL layer, and the semi-transmissive and semi-reflective electrode;
    a fourth light-emitting element comprising a fourth reflective electrode, a fourth transparent conductive film, the EL layer, and the semi-transmissive and semi-reflective electrode;
    a first color filter over the first light-emitting element;
    a second color filter over the second light-emitting element;
    a third color filter over the third light-emitting element; and
    a fourth color filter over the fourth light-emitting element,
    wherein the EL layer has a tandem structure which comprises:
        a first light-emitting layer including a first light-emitting substance; and
        a second light-emitting layer over the first light-emitting layer, the second light-emitting layer including a second light-emitting substance,
    wherein the first light-emitting substance exhibits one of blue light and yellow light,
    wherein the second light-emitting substance exhibits the other of blue light and yellow light,
    wherein the semi-transmissive and semi-reflective electrode covers an edge portion of the EL layer, and
    wherein the thicknesses of the first transparent conductive film, the second transparent conductive film, the third transparent conductive film, and the fourth transparent conductive film are different from one another.

9. The light-emitting device according to claim 8,
    wherein the first light-emitting substance emits fluorescence, and
    wherein the second light-emitting substance emits phosphorescence.

10. The light-emitting device according to claim 8,
    wherein the first light-emitting substance emits phosphorescence, and
    wherein the second light-emitting substance emits fluorescence.

11. The light-emitting device according to claim 8, wherein an optical path length between the fourth reflective electrode and the semi-transmissive and semi-reflective electrode is set so as to intensify yellow light.

12. The light-emitting device according to claim 8,
    wherein the first light-emitting substance has an emission spectrum peak within a range of greater than or equal to 420 nm and less than or equal to 480 nm, and
    wherein the second light-emitting substance has an emission spectrum peak within a range of greater than or equal to 540 nm and less than or equal to 580 nm.

13. The light-emitting device according to claim 8, wherein the edge portion of the EL layer includes a side surface of the EL layer.

14. The light-emitting device according to claim 8, further comprising a first flexible substrate and a second flexible substrate.

* * * * *